United States Patent [19]

Suzuki et al.

[11] Patent Number: 4,806,496
[45] Date of Patent: Feb. 21, 1989

[54] METHOD FOR MANUFACTURING PHOTOELECTRIC CONVERSION DEVICES

[75] Inventors: Kunio Suzuki, Tokyo; Ippei Kobayashi, Atsugi; Katsuhiko Shibata, Atsugi; Masato Susukida, Atsugi; Mikio Kinka, Atsugi; Takeshi Fukada, Ebina; Susumu Nagayama, Tokyo; Masayoshi Abe, Tokyo; Shunpei Yamazaki, Tokyo, all of Japan

[73] Assignee: Semiconductor Energy Laboratory Co. Ltd., Kanagawa, Japan

[21] Appl. No.: 7,780

[22] Filed: Jan. 28, 1987

[30] Foreign Application Priority Data

Jan. 29, 1986 [JP] Japan .................................. 61-17427
Jan. 29, 1986 [JP] Japan .................................. 61-17428
Jan. 29, 1986 [JP] Japan .................................. 61-17429

[51] Int. Cl.$^4$ .................... H01L 31/18; H01L 21/322
[52] U.S. Cl. ............................................. 437/4; 437/2; 437/8; 437/170; 437/923; 437/939; 136/258; 136/290; 136/244

[58] Field of Search ............... 437/2, 4, 170, 8, 939, 437/923; 29/572, 574, 575, 584; 136/250 AM, 258 PC, 290, 244

[56] References Cited

U.S. PATENT DOCUMENTS 4,166,918 9/1979 Nostrand et al. .................. 136/243
4,451,970 6/1984 Izu et al. ................................ 437/8

Primary Examiner—Aaron Weisstuch
Attorney, Agent, or Firm—Sixbey, Friedman, Leedom & Ferguson

[57] ABSTRACT

Photoelectric conversion devices are manufactured at high yield by repairing the devices during the final steps of the manufacuturing process. Short current paths resulting from the formation process of semiconductor layers can be eliminated by applying a reverse voltage to the layers, which thus are heated and made insulating. After the elimination of the short current paths, the reverse current no longer passes beyond 15 mA on a reverse voltage of 8 V.

9 Claims, 5 Drawing Sheets

4,806,496

METHOD FOR MANUFACTURING PHOTOELECTRIC CONVERSION DEVICES

BACKGROUND OF THE INVENTION

This invention relates to methods for manufacturing photoelectric conversion devices, and more particularly relates to methods including a step of eliminating short current paths resulting from the semiconductor preparing process.

Heretofore, a photoelectric conversion device which uses a non-single-crystalline semiconductor has been employed for solar cells of low retailing prices. Such devices have been produced mainly of compact types, for example with a small area such as several square centimeters whilst there have been some attempts to make a large area photoelectric conversion device such as of several thousands cm² in order to lower the cost per unit area. The large area devices, however, necessarily have therein many imperfections such as pinholes and cracks, which constitute shorting paths or, at least, current leaking portions. The fill factor of the device is lowered very much due to the imperfections and thereby the photoelectric conversion efficiency is degraded very much. Because of this the devices are produced only at a small yield and the production cost is not reduced so much. It is desirable, therefore, to eliminate short circuit current paths from the device in production of such large area solar cells.

One example of such attempts to eliminate short circuits is disclosed in Japanese Patent Published Application No. 60-46080. This attempt utilizes an etching solution in which is dipped one surface of a semiconductor layer having a pin junction, the other surface being provided with an electrode which is applied with a voltage in a manner so as to etch short current paths selectively. One embodiment of the art is described in this publication, page 376, line 9 on the left column to the top line on the right column. The etching solution is a water solution of hydrogen chloride at 0.01 to 1 weight % and sodium chloride at 0.05 mol %.

There, however, are many shortcomings in the disclosed prior art. Namely, the etched portions must be selectively filled afterwards with insulating material. Also, a metallic film cannot be formed in advance of etching since the etching solution contains acid which dissolves metal. Further, the art requires an additional process to eliminate efficiently water or other impurities which contact the semiconductor during etching.

Also another measure has been proposed in U.S. Pat. No. 4,166,918. In that patent the effects of electrical shorts are removed by applying a reverse bias voltage to burn out the short current paths in a semiconductor layer which is provided with a thick thermet film. However, after the removal, possible passages through the semiconductor layer remain which might constitute short current paths.

SUMMARY OF THE INVENTION

It is, therefore, an object of the invention to provide an improved method for manufacturing photoelectric conversion devices with a very low cost.

It is another object of the invention to provide an improved method for manufacturing photoelectric conversion devices which have excellent characteristics.

It is a further object of the invention to provide an improved method for manufacturing photoelectric conversion devices at a high yield.

It is a still further object of the invention to provide an improved method for manufacturing photoelectric conversion devices having high performance characteristics.

It is a yet still further object of the invention to provide an improved method for manufacturing photoelectric conversion devices having high conversion efficiency.

To accomplish the above objects, after forming a semiconductor layer with a photoelectric conversion region, the semiconductor layer is subjected to a reverse bias voltage, and short circuit current paths are burnt out and insulated by heat. Inferior articles that would otherwise have to be discarded can be repaired so that the yield of production is increased.

Also, the repairing treatment depresses the scattering of the characteristics of the products and lowers the possibility of deterioration of the device during use. The repairing can be implemented without large modification of a conventional process since the treatment can be carried out only after completion of the conventional process. According to the invention, the fill factor is especially improved since the parallel resistance component of the device increases, and eventually the conversion efficiency is improved.

After burning the short current paths are changed, for example, into stop-gaps made of oxide or nitride when the transparent electrode contiguous to the semiconductor layer is made of oxide or nitride.

DETAILED DESCRIPTION OF THE PREFERRED EMBODIMENTS

Figure 1:
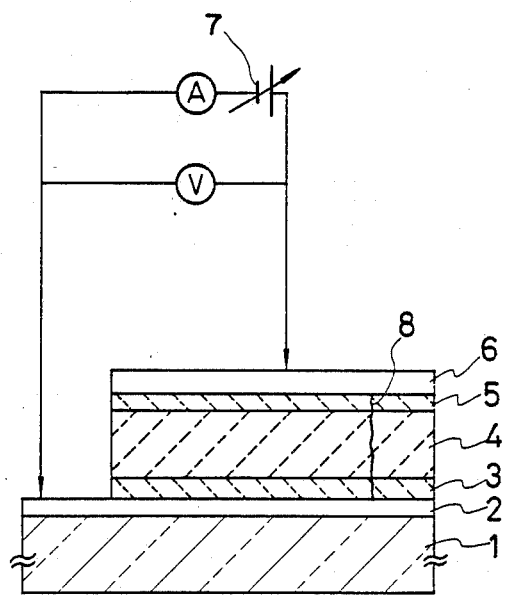
FIG. 1 is a schematic section view showing a method according to the invention.

Referring now to FIG. 1, a photoelectric conversion device according to the invention is illustrated. To facilitate understanding, the embodiment is depicted only with a simple pin junction. The device is comprised of a glass substrate 1, a first electrode 2, a p-type amorphous silicon semiconductor layer 3, an intrinsic type amorphous silicon semiconductor layer 4, an n-type amorphous silicon semiconductor layer 5, and a second electrode 6. The first electrode 2 and the second electrode 6 are connected to the negative terminal and the positive terminal, respectively, of a voltage source 7.

The output of the voltage source is increased gradually from zero to about 8 volts. The voltage-current relation of the device as determined in an experiment is graphically shown in FIG. 2.

Figure 2A:
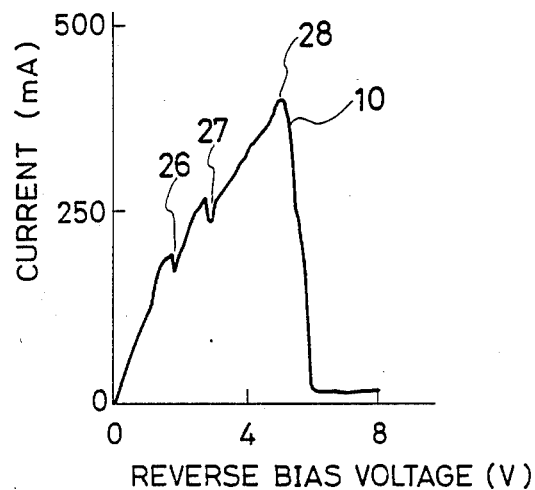
FIG. 2(A) is a graphical diagram showing the movement of current passing through a photoelectric conversion device subjected to a gradually increasing reverse voltage.

In FIG. 2(A) the current increase in proportion to the reverse bias voltage until about 5.5 V. The resistance in the range of 0 to 1 V reverse bias voltage is as small as 8.6 ohms, from which it is easily imagined that there might be a short current path 8. As the reverse bias voltage increases the current intermittently falls at many points. When the reverse bias voltage increases beyond about 5.5 V the current suddenly does not flow. The current remains low thereafter until about 8 V with a resistance of about 800 ohsm—90 times as high as that when the voltage is 0 to 1 V.

Figure 2B:
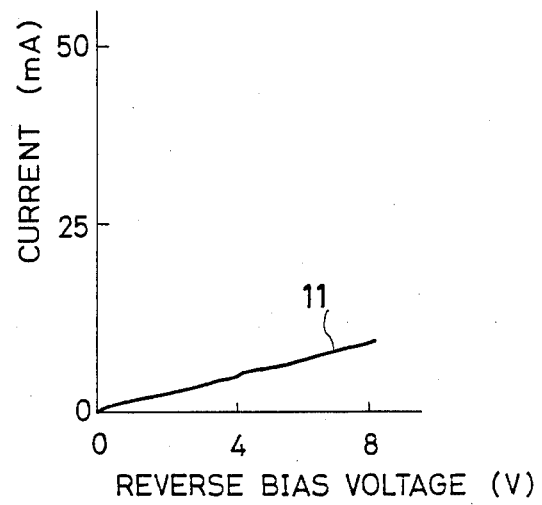
FIG. 2(B) is a graphical diagram of the voltage-current characteristic of a device manufactured according to the invention.

FIG. 2(B) is a graphical diagram showing the voltage-current characteristic of the device having undergone the reverse voltage application as shown in FIG. 2(A). The resistance is steady at no lower than 50 ohms and allows only 15 mA even at an applied reverse voltage, 8 V. It can be seen that short current paths have been burned out or made insulating during the initial voltage application.

Diodes with rectifying junctions, in general, do not exhibit the characteristic as illustrated in FIG. 2(A) in response to an application of a reverse bias. However, if short current paths exist, a current can pass selectively through the paths because of their apparently low resistance, referred to as R1, R2, ... and Rn<Ro hereinbelow. The short current paths are formed by dusts or flakes present in the semiconductor, so that the sectional areas of the paths are quite small and thereby the current density therethrough is high to such extent as to burn out, vaporize, oxidize or cause other similar phenomena, so as to eventually make the paths insulating. A device once having undergone the reverse bias treatment has an increased parallel resistance and an increased open circuit voltage, resulting in a high conversion efficiency. The reverse bias voltage may be applied in another manner as long as it gives a sufficiently large current passing through the short current paths.

EXPERIMENT 1

On a glass substrate 1 were formed a double-layered first electrode 2 made of indium tin oxide (ITO) film and $SnO_2$ film, a p-type semiconductor layer 3 of amorphous silicon carbide, an intrinsic semiconductor layer 4 of amorphous silicon, an n-type semiconductor layer 5 of microcrystal silicon, and a multi-layered second electrode 6 composed of ITO silver, and gold films. This conversion device was not integrated and the area thereof was 4.59 cm². Prior to the reverse bias treatment (RB), the conversion efficiency was scattered at 3 to 10% out of 150 samples and the yield was about 30%.

Figure 4:
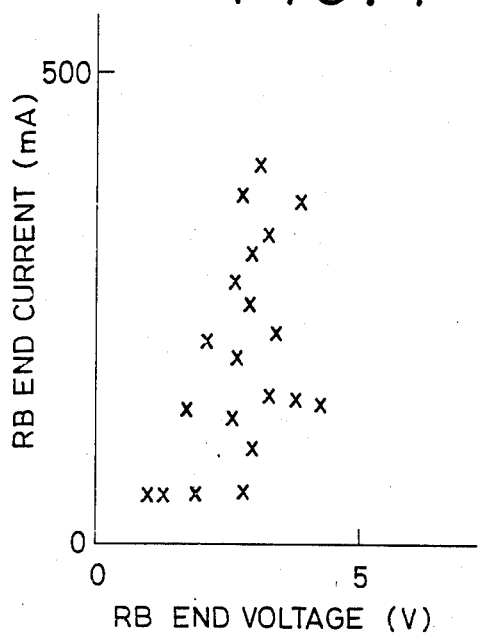
FIG. 4 is a diagram showing the distribution of the current and voltage point at which the repairing process is completed in accordance with the invention.

The 150 samples were then subjected to the reverse bias application as explained above in conjunction with FIG. 1. The output of the reverse bias voltage source 7 was increased to 8 V with the positive terminal connected to the second electrode 5 and with the negative terminal connected to the first electrode 2. The point at which reverse current causes to flow is called a RB end point in this description. In this experiment the RB end points congregated at about 3 to 5 V. The result is shown in FIG. 4 and Table 1, where Rsh represents the resistance under reverse bias application at 1 V.

TABLE 1

| | Before RB | After RB |
|---|---|---|
| number of samples (0 < Rsh ≦ 10 ohms) | 113 | 0 |
| number of samples (10 ohms < Rsh ≦ 1 Kohm) | 25 | 15 |
| number of samples (10 < Rsh ≦ 1 Kohm) | 12 | 139 |
| average conversion efficiency | 5.60% | 10% |

EXPERIMENT 2

On a glass substrate 1 were formed a double-layered first electrode 2 made of indium tin oxide (ITO) film and $SnO_2$ film, a p-type semiconductor layer 3 of amorphous silicon, an intrinsic semiconductor layer 4 of amorphous silicon semiconductor, an n-type semiconductor layer 5 of amorphous silicon, and an electrode 6 of aluminum.

Figure 5:
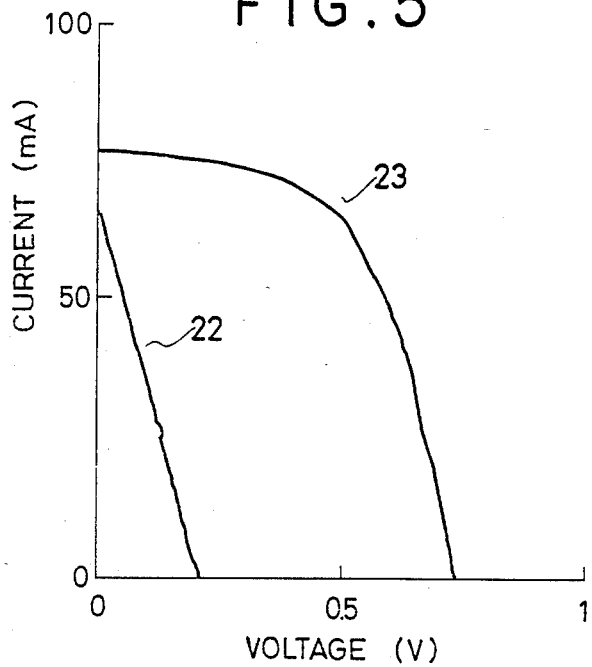
FIGS. 5 and 6 are graphical diagrams showing the photocurrents before and after a reverse voltage application of device manufacturing by the method of the invention.

The 150 samples were then subjected to the reverse bias application in a same manner as in the previous experiment. The representative characteristics of the devices before and after the reverse bias application (RB) are shown in FIG. 5 and the following Table 2. The voltage-current characteristics before and after the RB treatment are illustrated with curve 22 and a curve 23, respectively.

TABLE 2

| | Before RB | After RB |
|---|---|---|
| short circuit current (mA) | 46.500 | 76.040 |
| open circuit voltage (V) | 0.209 | 0.748 |
| fill factor | 0.348 | 0.572 |
| conversion efficiency (%) | 0.74 | 7.09 |

As shown in the above table, articles which are almost commercially non-acceptable could be remedied by applying the reverse bias for only 10 to 20 seconds. The characteristics of the 150 samples corresponding to the Table 1 are shown in the following.

TABLE 3

| | Before RB | After RB |
|---|---|---|
| number of samples (0 < Rsh ≦ 10 ohms) | 91 | 0 |
| number of samples (10 ohms < Rsh ≦ 1 Kohm) | 1 | 15 |
| number of samples (10 < Rsh ≦ 1 Kohms) | 52 | 139 |
| average conversion efficiency | 5.1% | 8.6% |

EXPERIMENT 3

Figure 3A:
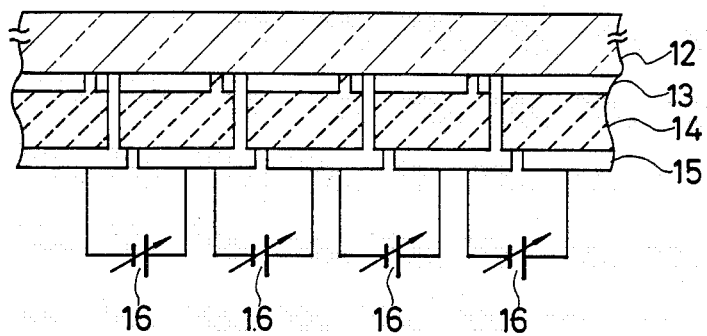
FIGS. 3(A) and (B) are sectional views showing other arrangements of a photoelectric conversion device and voltage supply for applying a reverse voltage to the device according to the invention.

This experiment was made using the configuration illustrated in FIG. 3(A). On a glass substrate 12 were formed a double-layered first electrode 13 made of an indium tin oxide (ITO) film and a $SnO_2$ film, a p-type semiconductor layer 14 of amorphous silicon carbide, an intrinsic semiconductor layer 14 of amorphous silicon, an n-type semiconductor layer 14 of microcrystalline silicon and a multi-layered second electrode 15 composed of ITO silver, and gold films. This conversion device was integrated into 15 series connected sections by severing each layer in suitable order and the area thereof was 69.83 cm². Prior to the reverse bias treatment, the yield of devices having an efficiency higher than 7% was about 30% out of 50 samples.

The 50 samples were then subjected to the reverse bias application with voltage sources 16 used for each section of the device as shown in FIG. 3(A). As a result, the output of the voltage source 16 for each section was increased to 8 V with the positive terminal connected to the second electrode 15 and the negative terminal connected to the first electrode 13. The result is shown in Table 4, where Rsh is the resistance under reverse bias application of 1 V. The RB end voltage point of the samples congregated at about 4 to 6 V.

TABLE 4

|  | Before RB | After RB |
|---|---|---|
| number of samples (0 < Rsh ≦ 10 ohms) | 40 | 0 |
| number of samples (10 ohms < Rsh ≦ 1 Kohm) | 10 | 15 |
| number of samples (10 < Rsh ≦ 1 Kohms) | 0 | 39 |
| average conversion efficiency | 4.5% | 9.5% |

All the treated samples were in a conversion efficiency range of 9.5±0.5% without substantial fluctuation.

EXPERIMENT 4

Figure 3B:
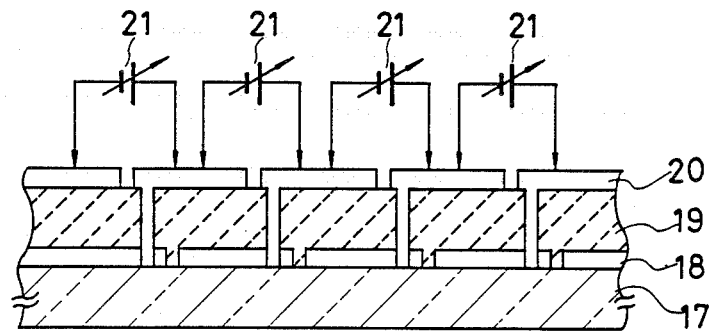

This experiment was made using the configuration illustrated in FIG. 3(B). On a glass substrate 17 were formed a double-layered first electrode 18 made of an indium tin oxide (ITO) film and a $SnO_2$ film, an n-type semiconductor layer 19 of amorphous silicon, an intrinsic semiconductor layer 19 of amorphous silicon, a p-type semiconductor layer 19 of amorphous silicon, and a second electrode 20 of ITO.

Figure 6:
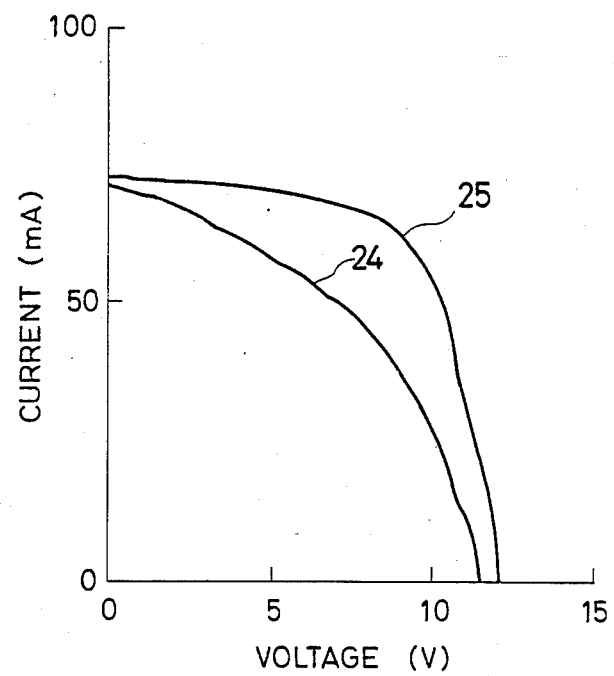

The 50 samples were then subjected to the reverse bias application in a same manner as in the previous experiment. The representative characteristics of the devices before and after the reverse bias application (RB) are shown in FIG. 6 and the following Table 5. The voltage-current characteristics before and after the RB treatment are illustrated by curve 22 and curve 23, respectively.

TABLE 5

|  | Before RB | After RB |
|---|---|---|
| short circuit current (mA) | 71.650 | 72.21 |
| open circuit voltage (V) | 11.486 | 12.074 |
| fill factor | 0.444 | 0.650 |
| conversion efficiency (%) | 4.53 | 8.23 |

As shown in the above table, the fill factor was especially increased and thereby the conversion efficiency was improved. The characteristics of the 50 samples corresponding to the Table 1 are shown in Table 6 below.

TABLE 6

|  | Before RB | After RB |
|---|---|---|
| number of samples (0 < Rsh ≦ 10 ohms) | 28 | 0 |
| number of samples (10 ohms < Rsh ≦ 1 Kohm) | 22 | 15 |
| number of samples (10 < Rsh ≦ Kohms) | 0 | 35 |
| average conversion efficiency | 4.7% | 7.5% |

EXPERIMENT 5

50 samples of devices of the same configuration as that of Experiment 1 were treated by the reverse bias application in the same manner as Experiment 1. Immediately after the application, the samples were measured without detaching the voltage supplying wires from the devices. Using the wires through which the reverse bias had been applied to the devices, a forward bias voltage was applied across the devices to investigate the electrical characteristics of the device. In this experiment, the devices were irradiated with light (AM1, 100 mW/cm$^2$). The forward bias application was implemented only by reversing the polarity of the voltage source 7. Of course a polarity reversing circuit may be provided between the devices and the voltage source to reverse the polarity of applied voltage. According to this measuring procedure, production cost of the device can be substantially reduced since checking of performance is executed continuously after the reverse bias curing.

In general, as the thickness of the intrinsic layer in a photoelectric conversion device increases, the number of imperfections residing in the device tends to increase, so that for very thin devices, some measures might be necessary to avoid burn-out of the device by a high temperature. In the above experiments, there arose no problem up to about 3000 Å in thickness of the intrinsic layer.

While several embodiments are particularly disclosed and described according to the present invention, many modifications and variations will easily occur to those skilled in the art. For example, a single voltage source may be utilized for applying a reverse bias to a device having a plurality of elements connected in parallel with each other with a circuit design in which a proper reverse voltage is applied to each element.

What is claimed is:

1. A method for curing defects of a photoelectric conversion device having first and second electrodes and a semiconductor layer inbetween incorporating a pin junction therein, said method comprising:
    connecting a voltage source and an ammeter in series between said first and second electrodes; and
    applying a reverse bias voltage less than the breakdown voltage across said semiconductor layer by said voltage source through said first and second electrodes, while the current passing through said semiconductor layer is monitored for the purpose of confirming the drop of said current which indicates burning out of the defects of said semiconductor layer.

2. The method of claim 1 wherein said reverse bias voltage is gradually increased during said applying step.

3. The method of claim 1 wherein said semiconductor layer is made of a non-single-crystalline semiconductor.

4. The method of claim 1 wherein after said reverse bias voltage applying step the electric characteristics of said device are tested using the connection between said electrode arrangement and the voltage supply for said reverse bias voltage applying step.

5. The method of claim 1 wherein said device is composed of a plurality of independent photoelectric conversion units which are connected with each other in series.

6. The method of claim 5 wherein each unit is provided with a respective reverse bias voltage.

7. The method of claim 1 wherein said electrode arrangement includes a transparent conductive oxide layer directly in contact with a surface of said semiconductor layer.

8. The method of claim 1 wherein said electrode arrangement includes a transparent conductive nitride layer directly in contact with a surface of said semiconductor layer.

9. The method of claim 1 wherein the voltage across said semiconductor layer is monitored, during said applying step, by a voltmeter connected between said first and second electrodes.

* * * * *